United States Patent
Negishi et al.

(10) Patent No.: US 7,659,147 B2
(45) Date of Patent: Feb. 9, 2010

(54) METHOD FOR CUTTING SOLID-STATE IMAGE PICKUP DEVICE

(75) Inventors: Yoshihisa Negishi, Minami-Ashigara (JP); Manjirou Watanabe, Minami-Ashigara (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 12/067,584

(22) PCT Filed: Sep. 19, 2006

(86) PCT No.: PCT/JP2006/318891

§ 371 (c)(1),
(2), (4) Date: May 19, 2008

(87) PCT Pub. No.: WO2007/034929

PCT Pub. Date: Mar. 29, 2007

(65) Prior Publication Data

US 2009/0098683 A1 Apr. 16, 2009

(30) Foreign Application Priority Data

Sep. 22, 2005 (JP) .............................. 2005-276622

(51) Int. Cl.
*H01L 21/02* (2006.01)
*H01L 21/301* (2006.01)

(52) U.S. Cl. .............................. 438/114; 257/E21.002; 257/E21.599

(58) Field of Classification Search ................. 438/114; 257/E21.002, E21.599
See application file for complete search history.

(56) References Cited

U.S. PATENT DOCUMENTS

| 2003/0123779 A1 | 7/2003 | Hashimoto |
| 2004/0189855 A1 | 9/2004 | Takasaki et al. |
| 2009/0046183 A1* | 2/2009 | Nishida et al. .............. 348/294 |

FOREIGN PATENT DOCUMENTS

| EP | 1 463 120 A2 | 9/2004 |
| JP | 2003-197885 A | 7/2003 |
| JP | 2004-6834 A | 1/2004 |
| JP | 2004-63782 A | 2/2004 |
| JP | 2004-312666 A | 11/2004 |

* cited by examiner

*Primary Examiner*—Matthew Smith
*Assistant Examiner*—Walter H Swanson
(74) *Attorney, Agent, or Firm*—Birch, Stewart, Kolasch & Birch, LLP

(57) ABSTRACT

In a method for cutting a solid-state image pickup device of the present invention, a glass cover plate is diced with a surface thereof being protected, so that chipping of the glass cover plate can be significantly prevented. In addition, since a CCD wafer is adhered after the glass cover plate is diced, no glass fragments scattered due to chipping of the glass cover plate touch the CCD wafer, or cause damage to the CCD wafer, thereby a cutting of solid-state image pickup device can be achieved with high accuracy and high quality.

6 Claims, 6 Drawing Sheets

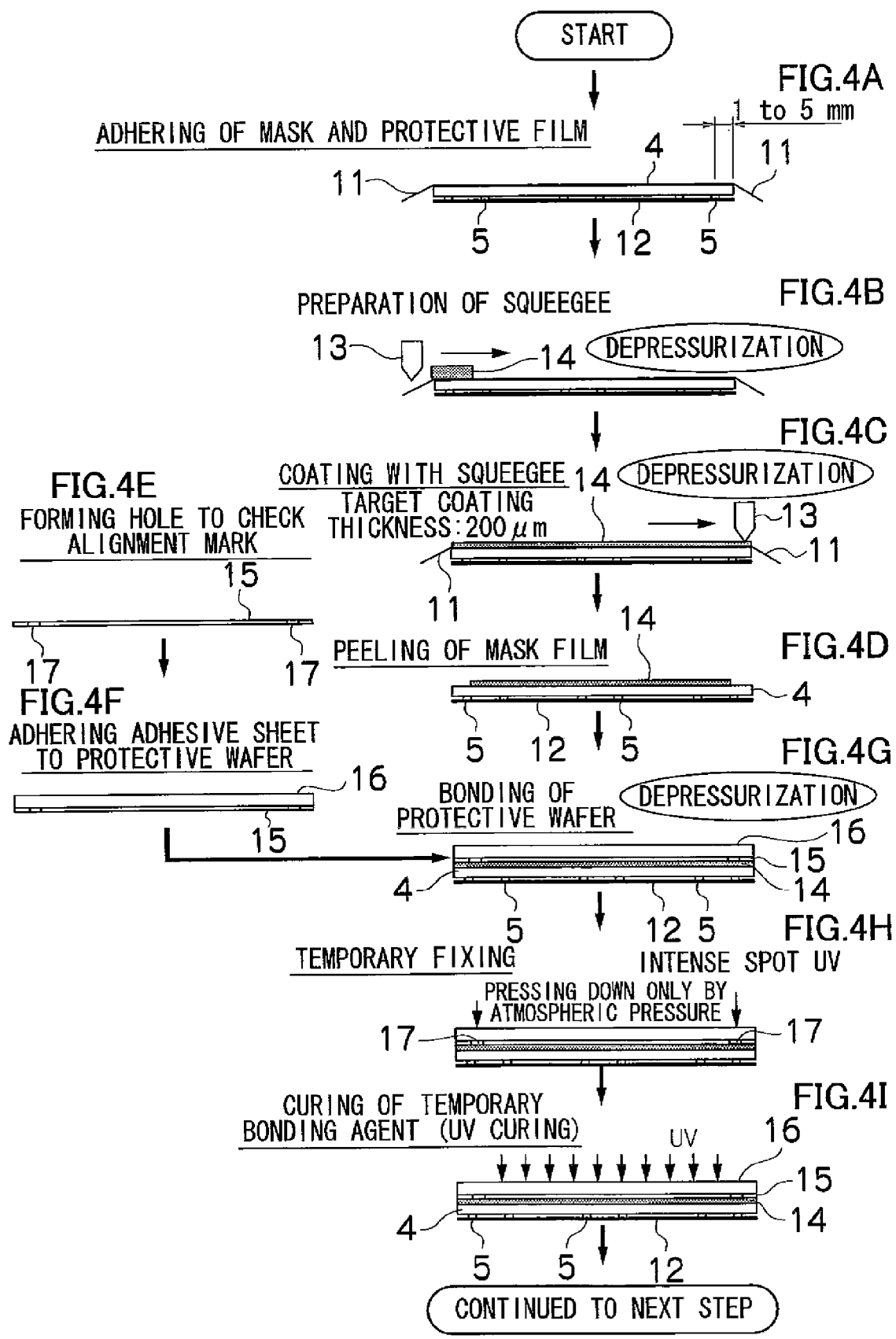

CONTINUED FROM PREVIOUS STEP

PEELING OF PROTECTIVE FILM

FULL-CUTTING PROCESS OF GLASS COVER PLATE

BONDING OF CCD WAFER

PEELING OF PROTECTIVE WAFER — HEATING AT 100°C

PEELING OF ADHESIVE SHEET

PEELING OF TEMPORARY BONDING AGENT — SOAKING IN HOT WATER AT 80°C

DICING OF CCD WAFER

END

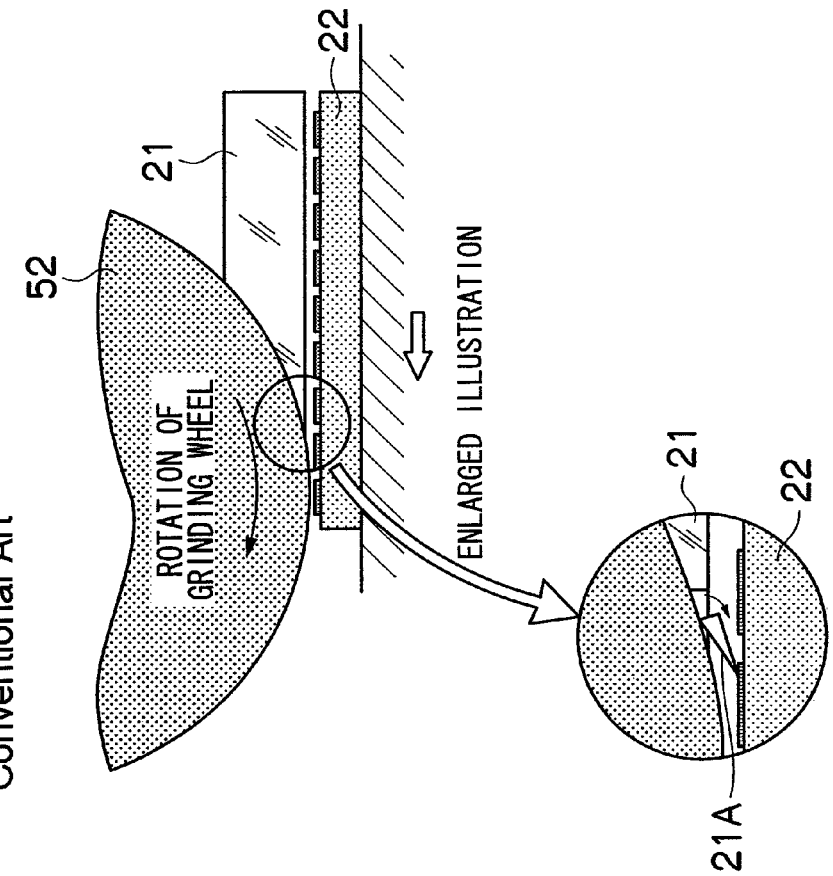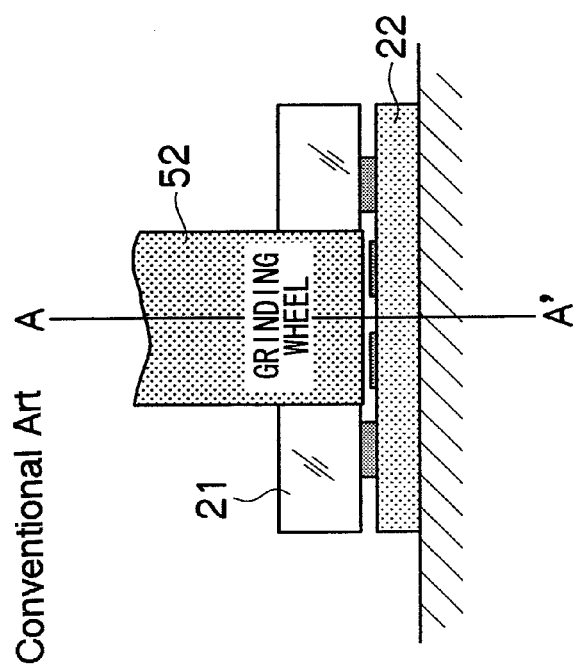

METHOD FOR CUTTING SOLID-STATE IMAGE PICKUP DEVICE

TECHNICAL FIELD

The present invention relates to a cutting method, in a manufacturing process of a solid-state image pickup device, for cutting a solid-state image pickup element wafer to which glass cover plate is adhered.

BACKGROUND ART

Recent market trend increasingly requires a miniaturization of solid-state image pickup devices which include CCD (Charge Coupled Device) or CMOS (Complementary Metal Oxide Semiconductor) for using in digital cameras and cell phones. Thus recently, CSP (Chip Size Package), the size of which is generally the same with that of a solid-state image pickup element chip, is becoming a standard type rather than the conventional large package system in which an entire solid-state image pickup element chip is hermetically sealed into a package of ceramics or the like.

In this context, a method has been proposed, which including: adhering a wafer (semiconductor substrate), in which a plurality of light receiving sections for solid-state image pickup elements are formed with separation grooves being provided between the adjacent light receiving sections, and a glass cover plate, which is a transparent glass sheet having spacer sections formed thereon at positions surrounding each light receiving section, to each other at the positions of the spacers so as to form spaces between the glass cover plate and the wafer; polishing the glass cover plate and the wafer by chemical mechanical polishing to the points to reach the separation grooves; and separating individual solid-state image pickup devices.

The separation grooves of the glass cover plate has a width required to expose a pad surface at outside of the light receiving sections of the solid-state image pickup elements to be provided with wiring from the exterior (for example, see Japanese Patent Application Laid-Open No. 2004-006834).

DISCLOSURE OF THE INVENTION

However, in the technique described in the above Japanese Patent Application Laid-Open No. 2004-006834, separation grooves needs to be formed both in the glass cover plate and the wafer in advance to separate individual solid-state image pickup devices, and then the glass cover plate and the wafer need to be polished to reduce their thickness by chemical mechanical polishing to the points to reach the separation grooves. This process results in a problem of taking a long time for the separation.

In order to resolve such a problem, another method can be assumed, which includes: preparing a dicing apparatus equipped with dicing blades (disc-shaped grindstones) having a width which expose a pad surface of a wafer; grinding and cutting a glass cover plate using the dicing apparatus so that the lowest point of one of the grindstones passes through the spacers described above; and grinding and cutting the wafer using another thin dicing blade. However, in this case using grindstones for grinding and cutting, there is a serious problem that when the spacer has an extremely narrow gap on the order of 100 μm between the wafer and the glass cover plate, for example, as shown in FIG. 6A and FIG. 6B showing a cross sectional view taken along the A-A' line of FIG. 6A and a partly enlarged illustration, in grinding and cutting the glass cover plate 21, glass fragments 21A are scattered due to chipping of a glass surface, and the glass fragments 21A get into the gap between the grindstone 52 and the wafer 22 to be tumbled or even dragged during the discharge, and as a result, cause damages to the wafer 22.

The present invention was made in view of the background described above, and one object of the present invention is to provide a method for cutting a solid-state image pickup device with high accuracy and high quality, without causing any chipping to prevent damages to a wafer surface in cutting a stack of a glass cover plate formed with a spacer and a solid-state image pickup device which is a wafer.

In order to achieve the above object, a first aspect of the present invention provides A method for cutting a solid-state image pickup device, in which a glass cover plate having a spacer formed thereto is adhered to a solid-state image pickup element wafer having a plurality of solid-state image pickup elements thereon for cutting the solid-state image pickup device into individual solid-state image pickup devices, comprising the steps of applying a masking film to a peripheral portion of a back surface of the cover glass which is opposite to a surface of the cover glass having the spacer formed thereto; coating a transparent temporary bonding agent having an adjustable adhesive strength to the surface to which the masking film is applied; peeling off the masking film after the coating of the temporary bonding agent; adhering a transparent protective wafer having a surface to which an adhesive sheet having a reducible adhesive strength is attached to the surface of the glass cover plate to which the temporary bonding agent is coated, with the adhesive sheet facing to the glass cover plate surface; cutting into the adhered glass cover plate and protective wafer from the surface of the glass cover plate and stopping at the temporary bonding agent; bonding the solid-state image pickup element wafer to the cut glass cover plate; peeling off the protective wafer, the adhesive sheet, and the temporary bonding agent after the bonding of the solid-state image pickup element wafer to the glass cover plate; and dividing individual solid-state image pickup devices by cutting the solid-state image pickup element wafer.

According to the first aspect of the present invention, a temporary bonding agent is coated into a thickness which is relatively large on the order of 200 μm to a back surface, opposite to the surface having the spacer, of the glass cover plate. Since the masking film is already applied to the peripheral portion of the surface to which the temporary bonding agent is coated of the glass cover plate, a peeling off of the masking film exposes an uncoated surface portion.

After the temporary bonding agent is coated, a protective wafer having a surface to which an adhesive sheet is attached is gently disposed on the temporary bonding agent to be adhered to the surface having the temporary bonding agent, with the adhesive sheet facing to the temporary bonding agent. Then the temporary bonding agent is cured by ultraviolet radiation, or the like. The adhesive sheet can be peeled off when its adhesive strength is reduced by heat, ultraviolet radiation, or the like.

After the curing of the temporary bonding agent, the adhered glass cover plate and the protective wafer is diced from the surface of the glass cover plate to the temporary bonding agent which is positioned at the adhered interface, and the a solid-state image pickup element wafer (hereinafter, referred to as a CCD wafer) is aligned to the diced glass cover plate to be adhered.

After the adhesion of the CCD wafer to the diced glass cover plate, the protective wafer, the adhesive sheet, and the temporary bonding agent are peeled off by heating or soaking in warm water, to divide individual chips by dicing the CCD wafer after the peeling.

In this way, the glass cover plate is diced with the surface thereof being protected, so that chipping of the glass cover plate can be significantly prevented. Since the CCD wafer is adhered to the glass cover plate after dicing, there is no possibility that any glass fragment scattered due to chipping touches the CCD wafer, or causes damages to the CCD wafer.

In a second aspect of the present invention, there is provided the method according to the first aspect, wherein the temporary bonding agent is coated in a depressurized environment.

According to the second aspect of the present invention, the depressurization removes bubbles which remain in the temporary bonding agent, and this minimizes bubbles contained in drops or coatings of the temporary bonding agent, so that a cutting of solid-state image pickup device can be achieved with high accuracy and high quality.

In a third aspect of the present invention, there is provided the method according to the first aspect or second aspect, wherein the adhesive sheet has a hole formed therein at a predetermined position in order to check an alignment mark which is used for an alignment of the glass cover plate and the solid-state image pickup element wafer.

According to the third aspect of the present invention, each of the glass cover plate and the CCD wafer has an alignment mark formed thereon for an accurate alignment, but the alignment marks cannot be used through the adhesive sheet which is typically opaque. In order to solve this problem, a hole having a diameter of about 4 mm is formed at a position in the adhesive sheet corresponding to the alignment marks to allow the alignment of the glass cover plate and the solid-state image pickup element wafer.

In a fourth aspect of the present invention, there is provided the method according to any one of the first, second, and third aspects, wherein the step of adhering the protective wafer to the glass cover plate with the adhesive sheet facing to the surface having the coating of the temporary bonding agent is performed in a depressurized environment, and the pressure is returned to a normal atmospheric pressure after the adhesion.

According to the fourth aspect of the present invention, the glass cover plate and the protective wafer are adhered to each other in a depressurized environment, and then are pressed down by the returned atmospheric pressure. This makes any air gaps, which are formed due to small variations in the coating thickness of the temporary bonding agent, pressed down, which causes the temporary bonding agent to be compressed to have a minimum and uniform thickness. This enables a cutting of solid-state image pickup devices with high accuracy and high quality.

In a fifth aspect of the present invention, there is provided the method according to any one of the first, second, third, and fourth aspects, wherein the adhesive strength of the temporary bonding agent is adjusted to be reduced in a condition which is different from a condition in which the adhesive strength of the adhesive sheet is reduced.

According to the fifth aspect of the present invention, since the adhesive strength of the adhesive sheet is reduced while the adhesive strength of the temporary bonding agent being maintained without reduction, this configuration facilitates the removal of the protective wafer and the temporary bonding agent which have no use after the bonding of the CCD wafer.

In a sixth aspect of the present invention, there is provided the method according to any one of the first, second, third, fourth, and fifth aspects, wherein the adhesive strength of the temporary bonding agent is increased in a condition which does not impair the transparency of the temporary bonding agent.

According to the sixth aspect of the present invention the temporary bonding agent on the alignment mark is cured upon irradiation of an intense ultraviolet radiation which does not impair the transparency of the temporary bonding agent in order to adhere the glass cover plate and the protective wafer to each other. This allows the alignment marks to be checked through the temporary bonding agent in adhering a CCD wafer, so that a cutting of solid-state image pickup device can be achieved with high accuracy and high quality.

As described above, according to the method for a cutting solid-state image pickup device of the present invention, a glass cover plate is diced with a surface thereof being protected, so that chipping of the glass cover plate can be significantly prevented. In addition, since a CCD wafer is adhered after the glass cover plate is diced, no glass fragments scattered due to chipping of the glass cover plate touch the CCD wafer, or cause damages to the CCD wafer, thereby a cutting of solid-state image pickup device can be achieved with high accuracy and high quality.

BRIEF DESCRIPTION OF THE DRAWINGS

FIGS. 4A to 4I are schematic diagrams showing procedures of a method for cutting a solid-state image pickup device (first half);

FIGS. 6A and 6B are conceptual diagrams illustrating a conventional cutting method.

DESCRIPTION OF SYMBOLS

1 . . . solid-state image pickup device, 2 . . . solid-state image pickup element chip, 3 . . . solid-state image pickup elements, 4 . . . glass cover plate, 5 . . . spacer, 6 . . . pad (electrode), 11 . . . masking film, 12 . . . protective film, 13 . . . squeegee, 14 . . . temporary bonding agent, 15 . . . adhesive sheet, 16 . . . protective wafer, 17 . . . hole, 18 . . . CCD wafer

BEST MODE FOR CARRYING OUT THE INVENTION

Now, preferred embodiments of a method for cutting a solid-state image pickup device according to the present invention will be explained in detail with reference to the accompanying drawings.

Figure 1:
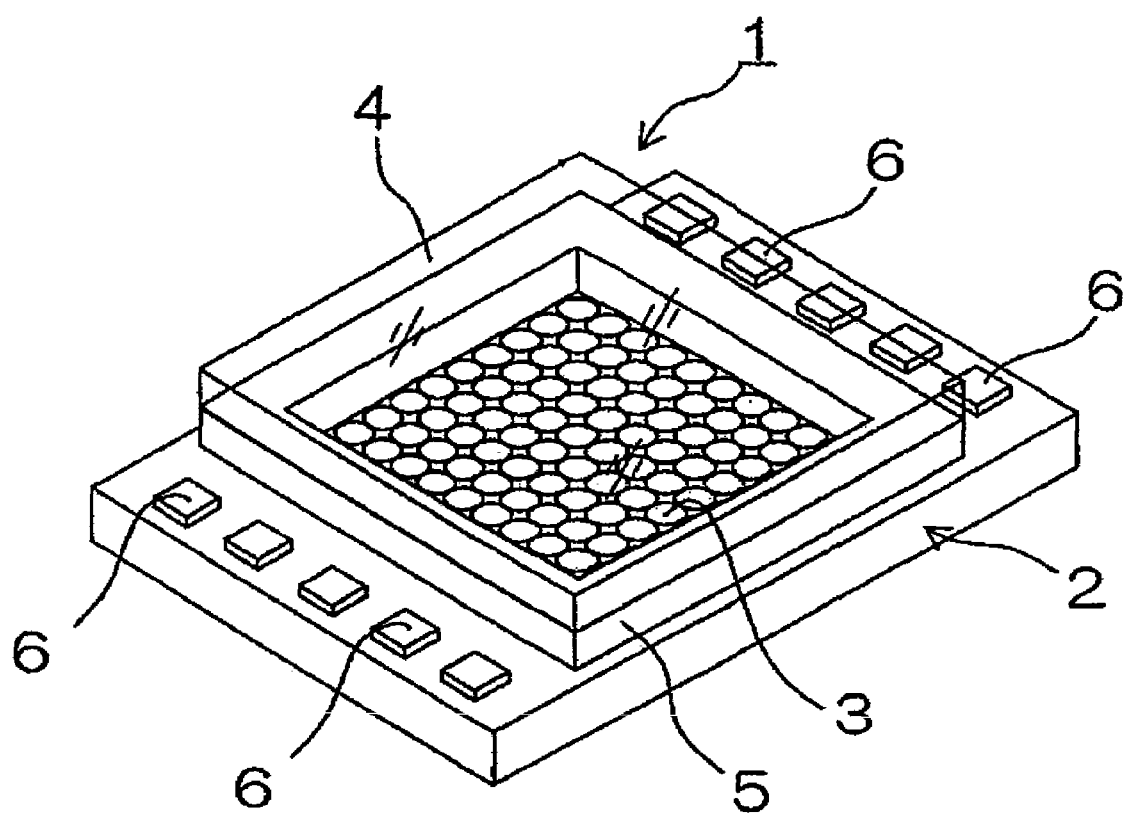
FIG. 1 is a perspective diagram showing an outline profile of an embodiment of a solid-state image pickup device according to the present invention.
Figure 2:
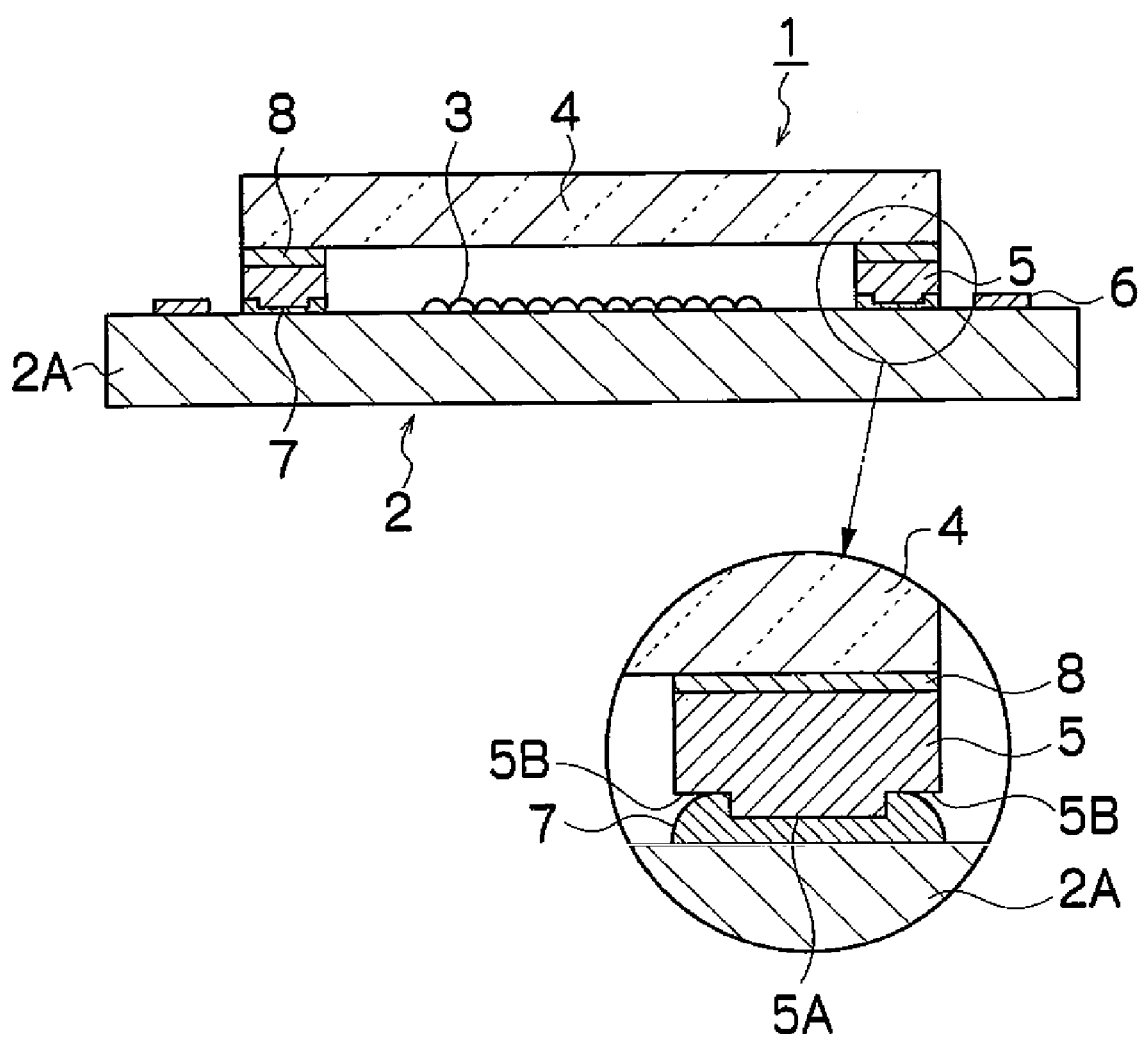
FIG. 2 is a cross sectional diagram showing main parts of an embodiment of a solid-state image pickup device according to the present invention.

FIG. 1 is a perspective diagram showing an outline profile of an embodiment of a CSP type solid-state image pickup device according to the present invention, and FIG. 2 is a cross sectional diagram showing the same. A solid-state image pickup device 1 comprises a solid-state image pickup element chip 2, solid-state image pickup elements 3 provided on the solid-state image pickup element chip 2, a frame-shaped spacer 5 which is mounted to the solid-state image pickup element chip 2 to surround the solid-state image pickup elements 3, and a glass cover plate 4 which is mounted on the spacer 5 to seal the solid-state image pickup elements 3 therein.

The solid-state image pickup element chip 2 comprises, as shown in FIG. 2, a rectangular chip substrate 2A, the solid-state image pickup elements 3 formed on the chip substrate 2A, and a plurality of pads (electrodes) 6 which are arrayed around the solid-state image pickup elements 3 to provide wiring to the exterior. The chip substrate 2A may be made of silicon single crystal for example, and may have a thickness on the order of 300 μm for example.

The glass cover plate 4 is a transparent glass having a thermal expansion coefficient which is close to that of silicon, and may be Pyrex® glass or the like which has a thickness on the order of 500 μm for example.

The spacer 5 is desirably made of an inorganic material having physical properties such as a thermal expansion coefficient which are close to those of the chip substrate 2A and the glass cover plate 4, and may be polycrystalline silicon for example. The frame-shaped spacer 5, when seen from a cross section, partly has a width on the order of 200 μm for example, and a thickness on the order of 100 μm for example. The spacer 5 is bonded to the chip substrate 2A using a first adhesive 7 at one end surface 5A thereof, and bonded to the glass cover plate 4 using a second adhesive 8 at the other end surface thereof.

The edge of the end surface 5A of the spacer 5 which is bonded to the chip substrate 2A is provided with a stepped portion 5B as shown in FIG. 2, and the stepped portion 5B functions to accommodate the first adhesive 7 which overflows under the spacer 5 and to prevent the first adhesive 7 from overflowing over the solid-state image pickup elements 3 or the pad 6 when the spacer 5 and the chip substrate 2A are bonded using a first adhesive 7. The stepped portion 5B extends from the end surface 5A by on the order of 30 μm for example.

Figure 3:
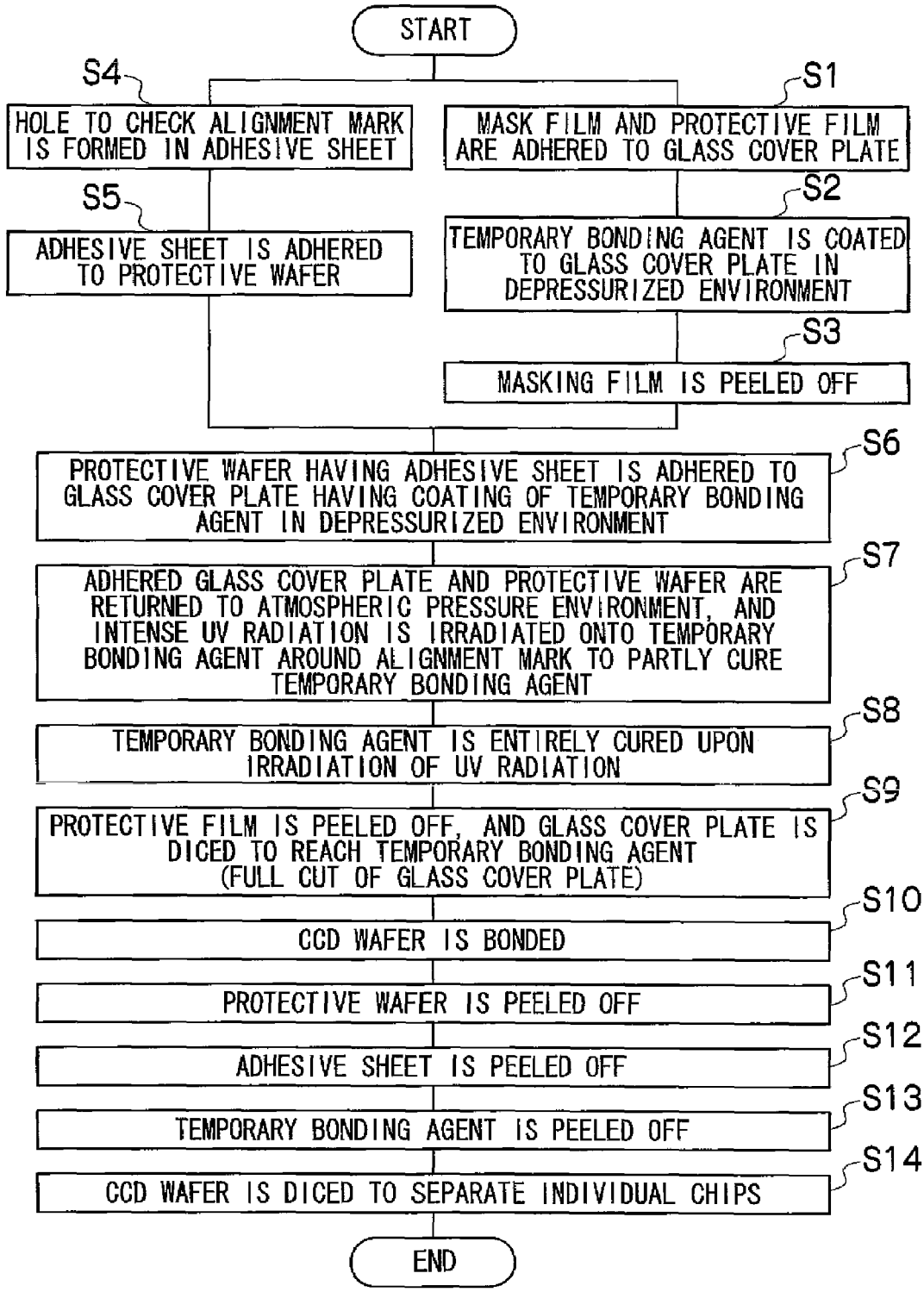
FIG. 3 is a flow chart showing a method for cutting a solid-state image pickup device.

Next, an embodiment of a method for cutting a solid-state image pickup device according to the present invention will be explained. FIG. 3 is a flow chart showing a method for cutting a solid-state image pickup device, and FIGS. 4A to 4I and FIGS. 5J to 5Q are views illustrating the flow chart.

First, as shown at FIG. 4A, a masking film 11 and a protective film 12 are adhered to a glass cover plate 4 having a spacer 5 mounted thereto (step S1).

The masking film 11 is a thin film material which can be easily peeled off, and is adhered to a peripheral portion having a width of 1 to 5 mm from an edge of a surface of the glass cover plate 4, opposite to the surface to which the spacer 5 is mounted. The masking film 11 may be a screen, a metal mask, or the like which are generally used in screen printing, other than a film material.

The protective film 12 is a thin film material which can be easily peeled off, and is adhered to cover an entire surface of the glass cover plate 4 relative to the spacer 5 in order to prevent any contamination or damage to the surface of the glass cover plate 4 on which the spacer 5 is attached. The protective film 12 can be eliminated if an automatic handling of wafers for example prevents any contamination or damage to wafers and glass cover plate surfaces.

The glass cover plate 4 to which the masking film 11 and the protective film 12 are adhered is, as shown at FIGS. 4B and 4C, placed in a depressurized environment to be applied with a coating of a temporary bonding agent 14 having a uniform thickness, onto the surface having the masking film 11, by using a squeegee 13 (step S2).

The temporary bonding agent 14 is made of a material which is transparent in a certain condition, and the material has an adhesive strength which is adjustable between a strength to resist cutting resistance in dicing and a strength to facilitate peeling, upon irradiation of ultraviolet radiation (hereinafter, referred to as UV radiation), heating by a heater, soaking in warm water, changing over time, or the like.

Specifically, some temporary bonding agents are commercially available, including TEMPLOC (manufactured by Denki Kagaku Kogyo Co., Ltd.) which cures upon irradiation of UV radiation, and swells after being soaked into hot water at 80° C. to enable its peeling; ECOSEPARA (manufactured by Kaken-Tech. Co., Ltd.) in which a binary liquid mixture cures over time, and the mixture is soaked in hot water at 90° C. so that a thermal blowing agent in the mixture reacts to enable its peeling; and a water soluble temporary fixing agents (manufactured by Adell Co., Ltd., and the like) which cure upon irradiation of UV radiation, and swell and are partly solved after being soaked into warm water to enable their peelings, and in consideration of such properties, a temporary bonding agent is selected for the temporary bonding agent 14. This embodiment will be explained by taking a case where TEMPLOC is selected for use.

The squeegee 13 is a bar member of a metal or a hard rubber, and a space between a lower surface of the squeegee 13 and a surface of the glass cover plate 4 to apply a coating of the temporary bonding agent 14 is set depending on a coefficient of viscosity, properties, a target coating thickness, and the like of temporary bonding agent 14. The coating thickness of the temporary bonding agent 14 is selected in consideration of workability in cutting the glass cover plate 4, and is desirably 50 μm or more, more desirably on the order of 200 μm which provides a relatively thick coating.

When the temporary bonding agent 14 is coated with the squeegee 13, the pressure in the environment for the coating is depressurized. A depressurization value is set within a range of 0.1 to 20 kPa for coating the temporary bonding agent 14 having a coefficient of viscosity of about 3 Pa·s into a target thickness on the order of 200 μm, with a coating speed being set within a range of 1 to 20 mm/s. This removes any bubbles remaining in the temporary bonding agent 14, and minimizes the bubbles taken in drops or uniform coating of the temporary bonding agent 14 with the squeegee 13.

After the coating of the temporary bonding agent 14, as shown at FIG. 4D, the masking film 11 is peeled off (step S3).

When the masking film 11 is peeled off after the coating of the temporary bonding agent 14, an uncoated region having a width of about 1 to 5 mm is formed around the temporary bonding agent 14.

While the temporary bonding agent 14 is coated, as shown at FIG. 4E, a plurality of holes 17 to check alignment marks are formed at positions in the adhesive sheet 15 corresponding to the alignment marks which are used for the alignment of the glass cover plate 4 and the CCD wafer, the holes having a diameter of around 4 mm (step S4).

The adhesive sheet 15 contains a material the adhesive strength of which can be reduced upon heating, irradiation of UV radiation, or the like. Specifically, some adhesive sheets are commercially available, including REVALPHA (manufactured by Nitto Denko Co., Ltd.) and Elegrip (manufactured by Denki Kagaku Kogyo Co., Ltd.) in which a thermal blowing agent in an adhesive layer reacts upon heating to enable its self-peeling, and SELFA (manufactured by Sekisui Chemical Co., Ltd.) in which a gas is produced in response to UV radiation to enable its self-peeling, and in consideration of such properties, an adhesive sheet is selected for the adhesive sheet 15. This embodiment will be explained by taking a case where REVALPHA is selected for use.

The adhesive sheet 15 having holes 17 formed therein has, as shown at FIG. 4F, a diameter which is the same with that of the glass cover plate 4, and is adhered to a surface of a transparent protective wafer 16 (step S5).

After the adhesion of the adhesive sheet 15, the protective wafer 16 is, as shown at FIG. 4G, gently disposed on the glass cover plate 4, to which the temporary bonding agent 14 is coated and from which the masking film 11 is already peeled off, to be adhered to the glass cover plate 4, with the adhesive sheet 15 facing to the coated temporary bonding agent 14 (step S6).

In the above adhesion, the positions of the alignment marks on the glass cover plate 4 and the holes 17 are adjusted so that the alignment marks can be checked through the holes 17. The above adhesion is performed in an environment depressurized by 0.1 to 20 kPa, where the depressurization value is equal to or more than that in the step S2 for coating the temporary bonding agent 14. This will not allow the bubbles formed in the step of coating the temporary bonding agent 14 to be formed again.

After the adhesion, the pressure in the environment where the adhered glass cover plate 4 and protective wafer 16 are disposed is returned to a normal atmospheric pressure. At the same time, as shown at FIG. 4H, an intense spot UV radiation is irradiated through the holes 17 onto the temporary bonding agent 14 to cure the temporary bonding agent 14 on the alignment marks formed on the glass cover plate 4 so that the glass cover plate 4 and the protective wafer 16 are temporarily fixed to each other (step S7).

In this configuration, the glass cover plate 4 and the protective wafer 16 are pressed down by the atmospheric pressure, thereby any air gaps which are formed due to small variations in the coating thickness of the temporary bonding agent 14 are compressed. Also, after the peeling of the masking film 11, there is formed an uncoated region. This region accommodates the temporary bonding agent 14 which is pressed down and overflows between the glass cover plate 4 and the protective wafer 16.

The intense UV radiation which is used to cure the temporary bonding agent 14 on the alignment marks has an intensity of 30 mW/cm$^2$, which is a typical UV radiation intensity required to cure TEMPLOC used in this embodiment, or an intensity above the typical UV radiation intensity which is required to cure other materials. Thus, if the temporary bonding agent 14 is cured with the typical UV radiation intensity, the transparency of the agent is impaired, but the temporary bonding agent 14 cured with an intense UV radiation does not lose its transparency, and thereby the alignment marks can be checked through the holes 17 after the curing. In this embodiment, the intense UV radiation has an intensity of 100 mW/cm$^2$.

The remaining temporary bonding agent 14 other than those on the alignment marks is, as shown at FIG. 4I, cured upon irradiation of UV radiation over the entire temporarily fixed glass cover plate 4 and protective wafer 16 (step S8).

When the temporary bonding agent 14 is based on acrylic material, the temporary bonding agent 14 inevitably gets shrunk upon irradiation of UV radiation, and depending on an irradiation condition, the cure shrinkage may have an in-plane difference. So, preferably a light source which has an in-plane uniform irradiation intensity is used, and a sufficient amount of UV radiation is irradiated using the light source.

Figure 5J:
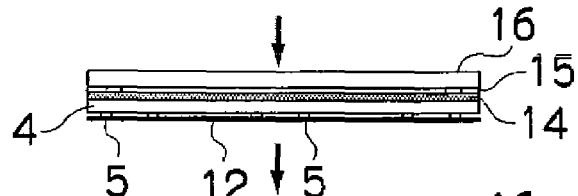
FIGS. 5J to 5Q are schematic diagrams showing procedures of a method for cutting a solid-state image pickup device (second half)
Figure 5K:
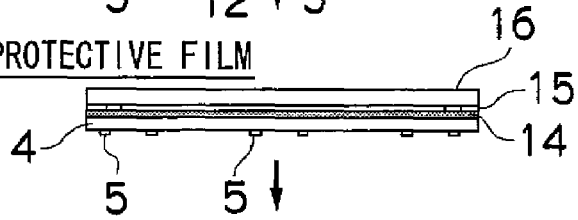
Figure 5L:
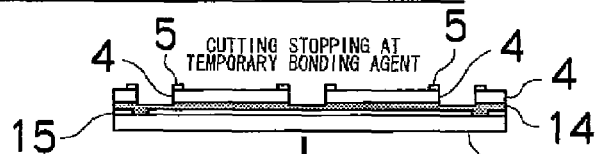

After the temporary bonding agent 14 is entirely cured, as shown at FIGS. 5K and 5L, the protective film 12 is peeled off, and the glass cover plate 4 is disposed on a dicing apparatus, with the surface having the spacer 5 facing upward, to be diced into a predetermined size (step S9).

In dicing, a dicing blade is set to cut through the glass cover plate 4 into the middle of the coating thickness of the temporary bonding agent 14. For example, when the temporary bonding agent 14 has a coating thickness of 200 μm, the dicing blade is preferably set to cut into the middle of the coating thickness to leave the coating of the temporary bonding agent 14 of 100 μm. This avoids cutting of grooves into the protective wafer 16, which in turn allows the protective wafer 16 to be reused.

The dicing blade may be preferably a resin bond grinding wheel having a particle size of 320 or more, and may preferably have a thickness which is close to the width of the cutting area in the spacer 5.

In this way, the glass cover plate 4 is diced using the dicing blade, with the cutting surface being protected, resulting in that chipping of the surface of the glass cover plate 4 can be prevented. In addition, since the glass cover plate 4 is diced before a CCD wafer is adhered thereto, no glass fragments due to chipping, if any, will touch the CCD wafer.

After the dicing of the glass cover plate 4, the surfaces of the glass cover plate 4 and the spacer 5 are cleaned and dried enough not to leave any debris or dirt thereon.

Figure 5M:
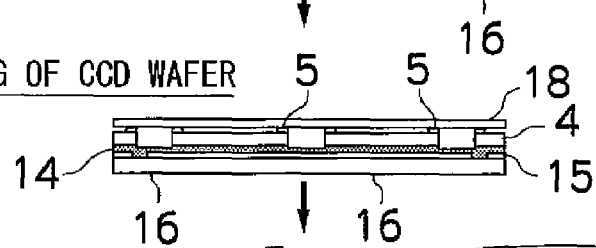

After the cleaning and drying of the glass cover plate 4, as shown at FIG. 5M, a CCD wafer 18 is completely fixed to the glass cover plate 4 by the adhesive coated on the end surface of the spacer 5 while adjusting the positions of the glass cover plate 14 and the CCD wafer 18 by checking the alignment marks through the holes 17 (step S10).

Figure 5N:
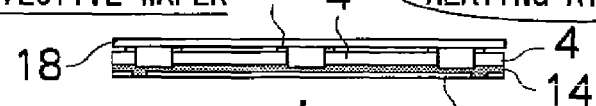
Figure 5O:
Figure 5P:
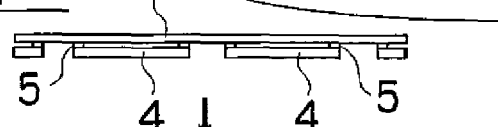

After the adhesive coated to the spacer 5 is completely cured to make the CCD wafer 18 securely bonded to the glass cover plate 4, as shown in FIG. 5N, the bonded glass cover plate 4 and CCD wafer 18 are heated to reduce the adhesive strength of the adhesive sheet 15, so that the protective wafer 16 is peeled off (step S11).

At this point, the temperature is increased to 100° C. or more, or the temperature is set as needed depending on a type of the adhesive sheet 15.

After the peeling of the protective wafer 16, the adhesive sheet 15 is peeled off from the temporary bonding agent 14 (step S12).

Since the adhesive sheet has a general-use (non-adhesive) surface having a lubricant coating, there is no exact adhesion between the general-use surface and the temporary bonding agent 14, and the adhesive sheet can be easily peeled off by hand.

After the peeling of the adhesive sheet 15, the glass cover plate 4 and the CCD wafer 18 are soaked in hot water to reduce the adhesive strength of the temporary bonding agent 14, so that the temporary bonding agent 14 is peeled off from the glass cover plate 4 (step S13).

When TEMPLOC is coated to have a thickness on the order of 200 μm, the glass cover plate 4 and the CCD wafer 18 are soaked in hot water at 80° C. for about five minutes, or in hot water at 60° C. for about twenty minutes.

The hot water contacts the entire surface of the temporary bonding agent 14 to which the adhesive sheet 15 was adhered, and also, flows through the kerf lines made by the dicing of the glass cover plate 4 to efficiently reach to an interface which is a back surface of the temporary bonding agent 14, which causes the temporary bonding agent 14 to swell from both entire surfaces thereof to lose its adhesive strength, and thereby the temporary bonding agent 14 can be easily peeled off from the glass cover plate 4.

After the peeling of the temporary bonding agent 14, the surfaces of the glass cover plate 4 and the CCD wafer 18 are cleaned and dried enough not to leave any debris or dirt thereon.

Figure 5Q:
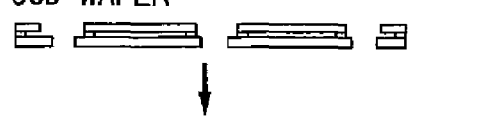

In the bonded glass cover plate 4 and CCD wafer 18 after the peeling of the temporary bonding agent 14, as shown at FIG. 5Q, the CCD wafer 18 is diced with a dicing apparatus to separate individual chips of a predetermined size (step S14).

Thus, since only the CCD wafer 18 is diced after the glass cover plate 4 is diced, no glass fragments due to chipping of the glass cover plate 4 will touch the CCD wafer 18, which enables a cutting with high accuracy and high quality.

As described above, according to a method for cutting a solid-state image pickup device of the present invention, a glass cover plate is diced with a surface thereof being protected, so that chipping of the glass cover plate can be significantly prevented. Also, a CCD wafer is bonded to the glass cover plate after the dicing, no glass fragments due to chipping will touch the CCD wafer, and will not cause any damage to the CCD wafer. Moreover, the surface of the glass cover plate is covered with a temporary bonding agent throughout processing to the final stage, and thereby there is less possibility that any debris or dirty cutting solution will contact the glass cover plate surface, which provides another effect that the glass cover plate surface is not likely to be contaminated.

In this embodiment, the intense UV radiation is irradiated only onto the temporary bonding agent on the alignment marks to maintain the transparency of the temporary bonding agent, but the present invention is not limited to this way of irradiation, and the temporary bonding agent on the alignment marks may be masked to keep its uncured transparency throughout the above processings. In this case also, the processings can be performed in the same way as described above.

In this embodiment, an adhesive sheet containing a thermally expandable material is used between a protective wafer and a temporary bonding agent, but if a temporary bonding agent also contains the thermally expandable material as in the adhesive sheet and its adhesive strength can be reduced by heating, the glass cover plate and the protective wafer can be directly adhered to each other, which eliminates the use of an adhesive sheet. In this case, since the thermally expandable material is opaque, the alignment mark needs to be masked not to be coated with the material.

The invention claimed is:

1. A method for cutting a solid-state image pickup device, in which a glass cover plate having a spacer formed thereto is adhered to a solid-state image pickup element wafer having a plurality of solid-state image pickup elements thereon for cutting the solid-state image pickup device into individual solid-state image pickup devices, comprising the steps of:

applying a masking film to a peripheral portion of a back surface of the glass cover which is opposite to surface of the glass cover having the spacer formed thereto;

coating a transparent temporary bonding agent having an adjustable adhesive strength to the surface to which the masking film is applied;

peeling off the masking film after the coating of the temporary bonding agent;

adhering a transparent protective wafer having a surface to which an adhesive sheet having a reducible adhesive strength is attached to the surface of the glass cover plate to which the temporary bonding agent is coated, with the adhesive sheet facing to the glass cover plate surface;

cutting into the adhered glass cover plate and protective wafer from the surface of the glass cover plate and stopping at the temporary bonding agent;

bonding the solid-state image pickup element wafer to the cut glass cover plate;

peeling off the protective wafer, the adhesive sheet, and the temporary bonding agent after the bonding of the solid-state image pickup element wafer to the glass cover plate; and dividing individual solid-state image pickup devices by cutting the solid-state image pickup element wafer.

2. The method for cutting a solid-state image pickup device according to claim 1, wherein
the temporary bonding agent is coated in a depressurized environment.

3. The method for cutting a solid-state image pickup device according to claim 1, wherein
the adhesive sheet has a hole formed therein at positions corresponding to an alignment mark which is used for an alignment of the glass cover plate and the solid-state image pickup element wafer.

4. The method for cutting a solid-state image pickup device according to claim 1, wherein
the step of adhering the protective wafer to the glass cover plate with the adhesive sheet facing to the surface having the coating of the temporary bonding agent is performed in a depressurized environment, and the pressure is returned to a normal atmospheric pressure after the adhesion.

5. The method for cutting a solid state image pickup device according to claim 1, wherein
the adhesive strength of the temporary bonding agent is adjusted to be reduced in a condition which is different from a condition in which the adhesive strength of the adhesive sheet is reduced.

6. The method for cutting a solid-state image pickup device according to claim 1, wherein
the adhesive strength of the temporary bonding agent is increased in a condition which does not impair the transparency of the temporary bonding agent.

* * * * *